(12) United States Patent
Parekh et al.

(10) Patent No.: US 6,309,941 B1
(45) Date of Patent: *Oct. 30, 2001

(54) METHODS OF FORMING CAPACITORS

(75) Inventors: Kunal R. Parekh; John K. Zahurak; Phillip G. Wald, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/765,510

(22) Filed: Jan. 19, 2001

Related U.S. Application Data

(63) Continuation of application No. 08/887,742, filed on Jul. 3, 1997, now Pat. No. 6,207,523.

(51) Int. Cl.[7] .................................................. H01L 21/20
(52) U.S. Cl. .......................... 438/396; 438/257; 438/255; 438/396
(58) Field of Search .................................. 438/396, 255, 438/253, 398, 254, 256, 293–296

(56) References Cited

U.S. PATENT DOCUMENTS

| | | |
|---|---|---|
| 5,338,700 | 8/1994 | Dennison et al. . |
| 5,340,765 | 8/1994 | Dennison et al. . |
| 5,383,150 | 1/1995 | Nakamura et al. . |
| 5,401,681 | 3/1995 | Dennison . |
| 5,418,180 * | 5/1995 | Brown .................................. 438/398 |
| 5,597,756 | 1/1997 | Fazan et al. . |
| 5,639,689 | 6/1997 | Woo . |
| 5,663,085 | 9/1997 | Tanigawa . |
| 5,686,747 | 11/1997 | Jost et al. . |
| 5,745,336 | 4/1998 | Saito et al. . |
| 5,763,286 | 6/1998 | Figura et al. . |
| 5,786,250 | 7/1998 | Wu et al. . |
| 5,874,335 | 2/1999 | Jenq et al. . |
| 5,885,866 | 3/1999 | Chen . |
| 5,897,352 | 4/1999 | Lin et al. . |
| 5,913,129 | 6/1999 | Wu et al. . |
| 5,923,973 | 7/1999 | Chen et al. . |
| 5,981,333 | 11/1999 | Parekh et al. . |
| 5,981,334 | 11/1999 | Chien et al. . |
| 6,015,983 | 1/2000 | Parehk . |
| 6,034,391 | 3/2000 | Tobita . |
| 6,037,220 | 3/2000 | Chien et al. . |

OTHER PUBLICATIONS

Aoki, Masami, et al., "Fully Self–Aligned 6F$^2$ Cell Techonology For Low Cost 1 Gb DRAM", Symposium On VLSI Digest of Technical Papers, *IEEE*, pp. 22–23 (1996).

* cited by examiner

*Primary Examiner*—Charles Bowers
*Assistant Examiner*—Yennhu B. Huynh
(74) *Attorney, Agent, or Firm*—Wells, St. John, Roberts, Gregory & Matkin PS

(57) ABSTRACT

The invention includes a number of methods and structures pertaining to semiconductor circuit technology, including: methods of forming DRAM memory cell constructions; methods of forming capacitor constructions; DRAM memory cell constructions; capacitor constructions; and monolithic integrated circuitry. The invention includes a method of forming a capacitor comprising the following steps: a) forming a mass of silicon material over a node location, the mass comprising exposed doped silicon and exposed undoped silicon; b) substantially selectively forming rugged polysilicon from the exposed undoped silicon and not from the exposed doped silicon; and c) forming a capacitor dielectric layer and a complementary capacitor plate proximate the rugged polysilicon and doped silicon. The invention also includes a capacitor comprising: a) a first capacitor plate; b) a second capacitor plate; c) a capacitor dielectric layer intermediate the first and second capacitor plates; and d) at least one of the first and second capacitor plates comprising a surface against the capacitor dielectric layer and wherein said surface comprises both doped rugged polysilicon and doped non-rugged polysilicon.

41 Claims, 17 Drawing Sheets

METHODS OF FORMING CAPACITORS

CROSS REFERENCE TO RELATED APPLICATION

This is a Continuation of U.S. patent application Ser. No. 08/887,742, filed Jul. 3, 1997 now U.S. Pat. No. 6,207,523, and titled "Capacitors, DRAM Arrays, Monolithic Integrated Circuits, and Methods of Forming Capacitors, DRAM Arrays, and Monolithic Integrated Circuits."

TECHNICAL FIELD

The invention pertains to semiconductor capacitor constructions and to methods of forming semiconductor capacitor constructions. The invention is thought to have particular significance in application to Methods of forming dynamic random access memory (DRAM) cell structures, to DRAM cell structures, and to integrated circuitry incorporating DRAM cell structures.

BACKGROUND OF THE INVENTION

A commonly used semiconductor memory device is a DRAM cell. A DRAM cell generally consists of a capacitor coupled through a transistor to a bitline. A semiconductor wafer fragment 10 is illustrated in FIG. 1 showing a prior art DRAM array 83. Wafer fragment 10 comprises a semiconductive material 12, field oxide regions 14, and wordlines 24 and 26. Wordlines 24 and 26 comprise a gate oxide layer 16, a polysilicon layer 18, a silicide layer 20 and a silicon oxide layer 22. Silicide layer 20 comprises a refractory metal silicide, such as tungsten silicide, and polysilicon layer 18 typically comprises polysilicon doped with a conductivity enhancing dopant. Nitride spacers 30 are laterally adjacent wordlines 24 and 26.

Electrical node locations 25, 27 and 29 are between wordlines 24 and 26 and are electrically connected by transistor gates comprised by wordlines 24 and 26. Node locations 25, 27 and 29 are diffusion regions formed within semiconductive material 12.

A borophosphosilicate glass (BPSG) layer 34 is over semiconductive material 12 and wordlines 24 and 26. An oxide layer 32 is provided between BPSG layer 34 and material 12. Oxide layer 32 inhibits diffusion of phosphorus from BPSG layer 34 into underlying material.

Conductive pedestals 54, 55 and 56 extend through BPSG layer 34 to node locations 25, 27 and 29, respectively. Capacitor constructions 62 and 64 contact upper surfaces of pedestals 54 and 56, respectively. Capacitor constructions 62 and 64 comprise a storage node layer 66, a dielectric layer 68, and a cell plate layer 70. Dielectric layer 68 comprises an electrically insulative layer, such as silicon nitride. Cell plate layer 70 comprises conductively doped polysilicon, and may alternatively be referred to as a cell layer 70. Storage node layer 66 comprises conductively doped hemispherical grain (HSG) polysilicon.

A conductive bitline plug 75 contacts an upper surface of pedestal 55. Bitline plug 75 may comprise, for example, tungsten. Together, bitline plug 75 and pedestal 55 comprise a bitline contact 77.

A bitline 76 extends over capacitors 62 and 64 and in electrical connection with bitline contact 77. Bitline 76 may comprise, for example, aluminum.

The capacitors 62 and 64 are electrically connected to bitline contact 77 through transistor gates comprised by wordlines 26. A first DRAM cell 79 comprises capacitor 62 electrically connected to bitline 76 through a wordline 26 and bitline contact 77. A second DRAM cell 81 comprises capacitor 64 electrically connected to bitline 76 through wordline a 26 and bitline contact 77. DRAM array 83 comprises first and second DRAM cells 79 and 81.

If capacitors 62 and 64 are inadvertently shorted together, a so-called "double bit failure" will occur, such double bit failures can occur if a stray piece of polysilicon, or HSG polysilicon, breaks off during formation of DRAM array 83 and disadvantageously electrically connects capacitors 62 and 64. Prior art capacitor fabrication methods employ chemical-mechanical polishing (CMP) of HSG polysilicon. HSG polysilicon pieces can break off during such CMP processes and cause double bit failures. It would be desirable to develop alternative DRAM constructions which could be formed by methods avoiding double bit failures.

SUMMARY OF THE INVENTION

The invention includes a number of methods and structures pertaining to semiconductor circuit technology, including: methods of forming DRAM memory cell constructions; methods of forming capacitor constructions; DRAM memory cell constructions; capacitor constructions; and integrated circuitry. For instance, the invention encompasses a method of forming a capacitor wherein a mass of silicon material is formed over a node location, and wherein the mass comprises exposed doped silicon and exposed undoped silicon. The method can further include substantially selectively forming rugged polysilicon from the exposed undoped silicon and not from the exposed doped silicon. Also, the method can include forming a capacitor dielectric layer and a complementary capacitor plate proximate the rugged polysilicon and doped silicon.

As another example the invention encompasses a capacitor having a capacitor dielectric layer intermediate a first capacitor plate and a second capacitor plate, wherein at least one of the first and second capacitor plates has a surface against the capacitor dielectric layer, and wherein said surface comprises both doped rugged polysilicon and doped non-rugged polysilicon.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Methods of forming DRAM arrays of the present invention are described with reference to FIGS. 2–17, with FIGS. 2–13 pertaining to a first embodiment of the invention, and FIGS. 14–17 pertaining to a second embodiment of the invention. In describing the first embodiment of the present invention, like numerals from the preceding discussion of the prior art are utilized where appropriate, with differences being indicated by the suffix "a" or with different numerals.

Figure 1:
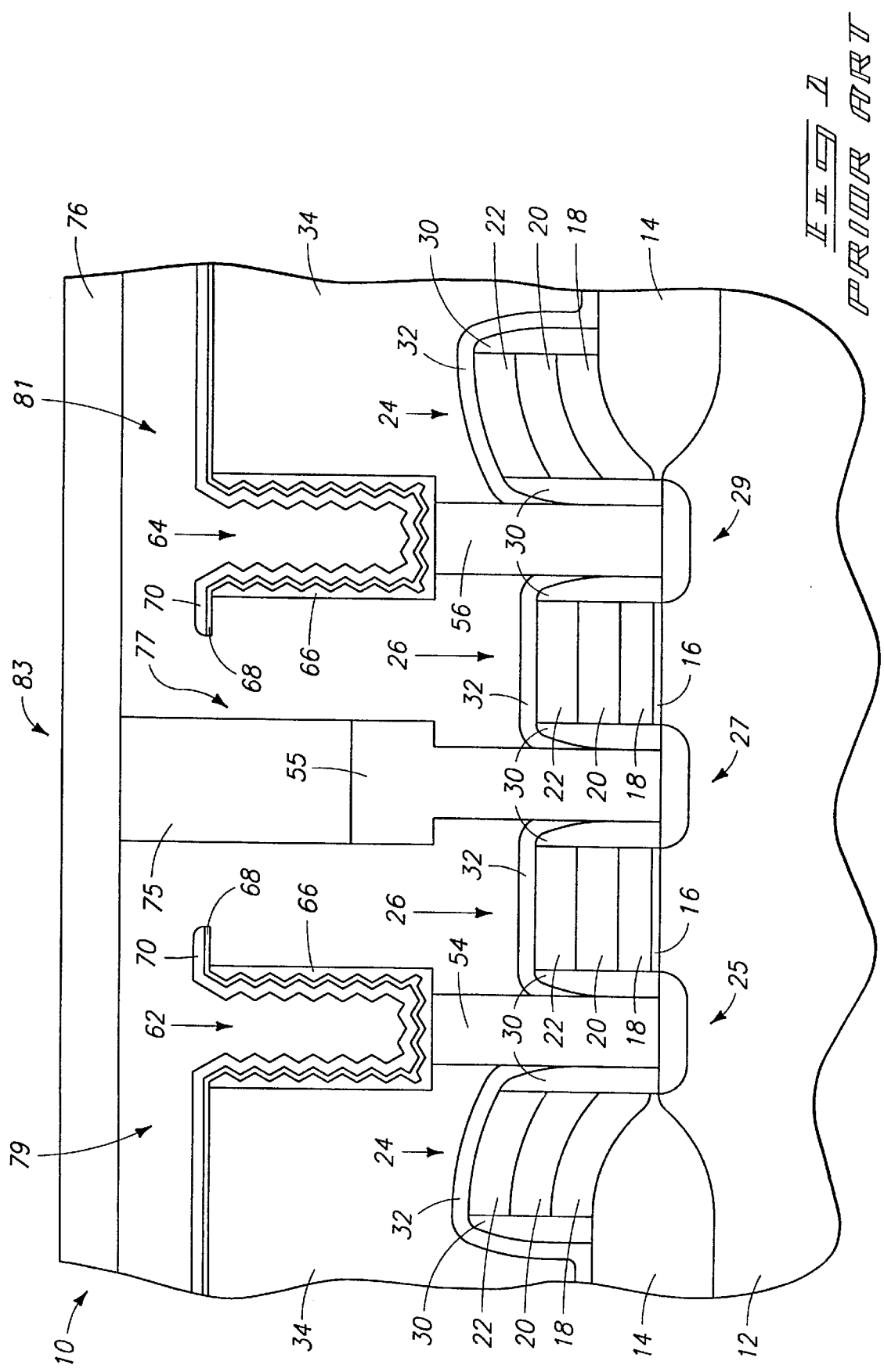
FIG. 1 is a schematic cross-sectional view of a semiconductor wafer fragment comprising a prior art DRAM array.
Figure 2:
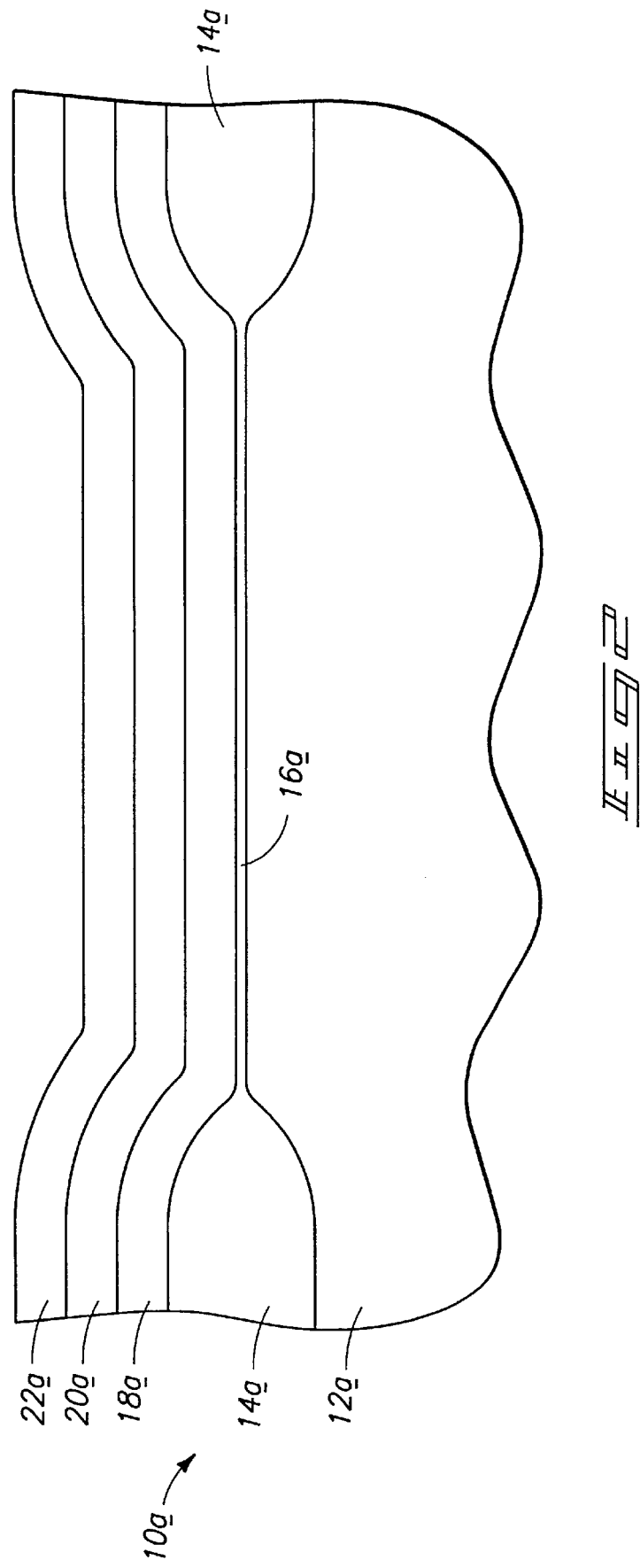
FIG. 2 is a schematic cross-sectional process view of a semiconductor wafer fragment at preliminary processing step of a processing method of the present invention.

Referring to FIG. 2, a semiconductor wafer fragment 10a is illustrated at a preliminary step of a process of the present invention. Wafer fragment 10a comprises a semiconductive material 12a, field oxide regions 14a, and a thin gate oxide layer 16a. Over gate oxide layer 16a is formed polysilicon layer 18a, silicide layer 20a and silicon oxide layer 22a. Silicide layer 20a comprises a refractory metal silicide, such as tungsten silicide, and polysilicon layer 18a typically comprises polysilicon doped with a conductivity enhancing dopant. Layers 16a, 18a, 20a and 22a can be formed by conventional methods.

Figure 3:
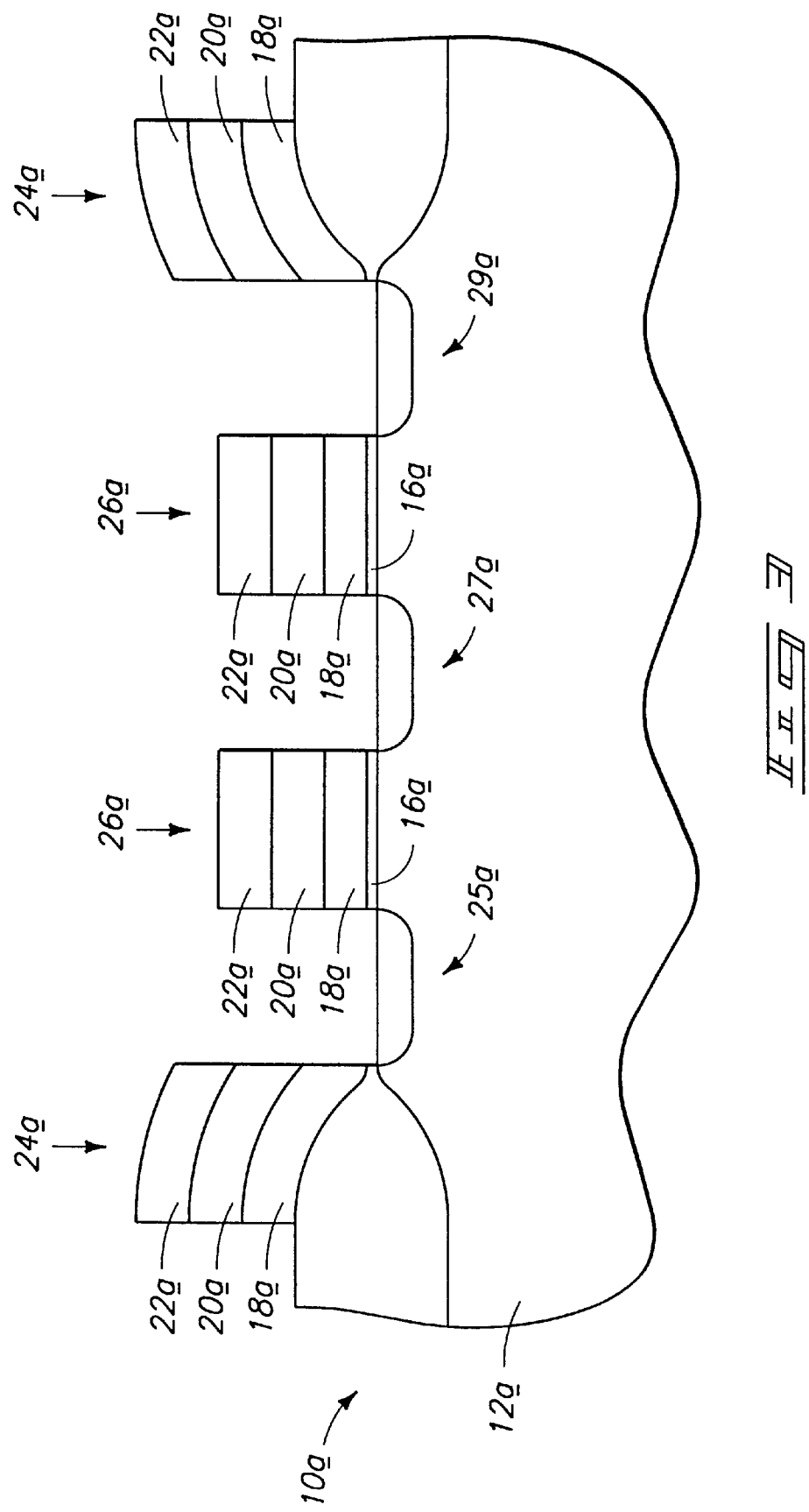
FIG. 3 is a view of the FIG. 2 wafer fragment at a processing step subsequent to that of FIG. 2.

Referring next to FIG. 3, polysilicon layer 18a, silicide layer 20a and silicon oxide layer 22a are etched to form wordlines 24a and 26a. Such etching can be accomplished by conventional methods. Between wordlines 24a and 26a are defined electrical node locations 25a, 27a and 29a, with wordlines 26a comprising transistor gates which electrically connect node locations 25a, 27a, and 29a. Node locations 25a, 27a and 29a are diffusion regions formed within semiconductive material 12a.

Figure 4:
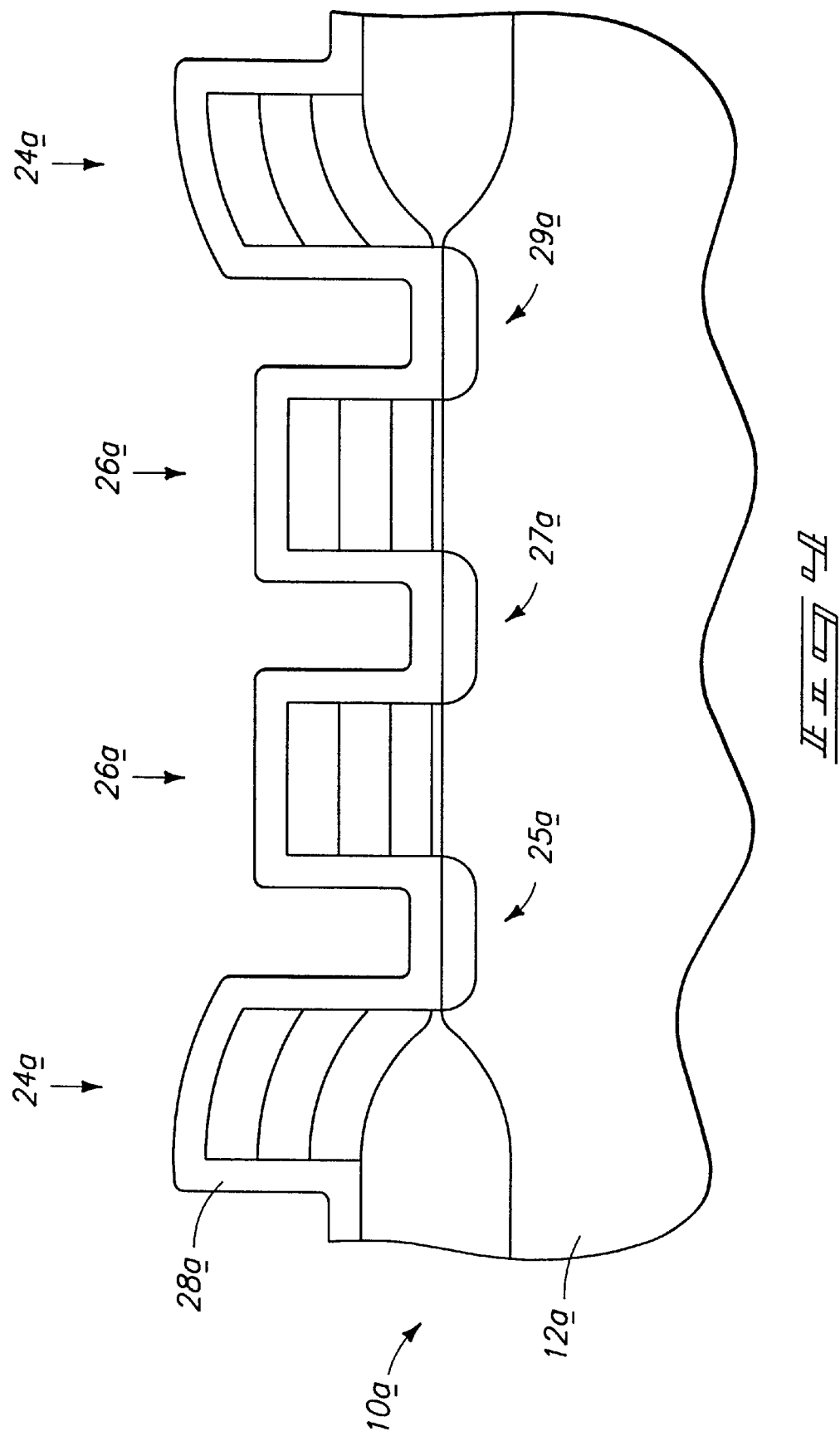
FIG. 4 is a view of the FIG. 2 wafer fragment at a processing step subsequent to that of FIG. 3.
Figure 5:
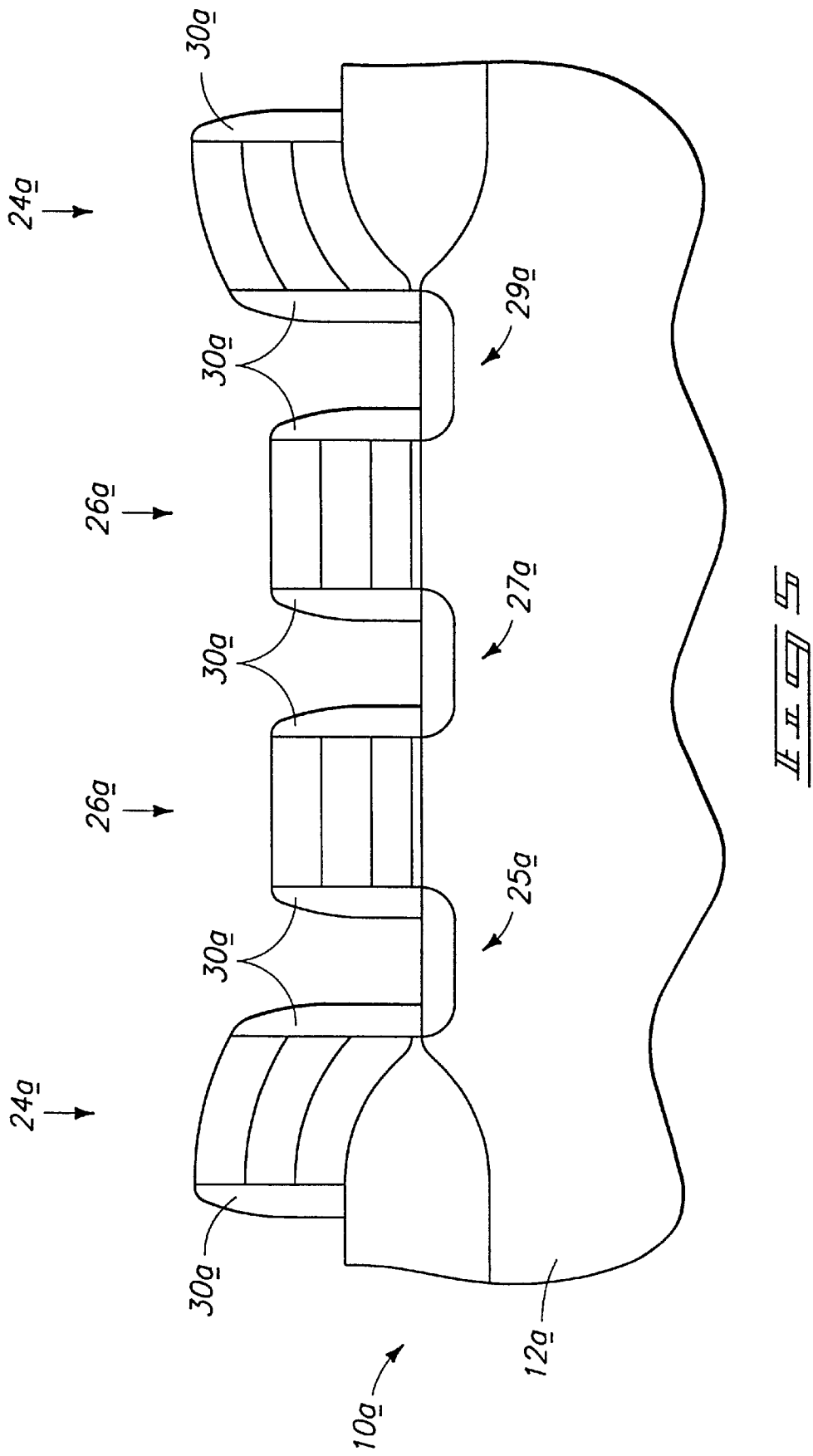
FIG. 5 is a view of the FIG. 2 wafer fragment at a processing step subsequent to that of FIG. 4.

Referring to FIGS. 4 and 5, a nitride layer 28a is provided over wordlines 24a and 26a and subsequently etched to form nitride spacers 30a laterally adjacent wordlines 24a and 26a.

Figure 6:
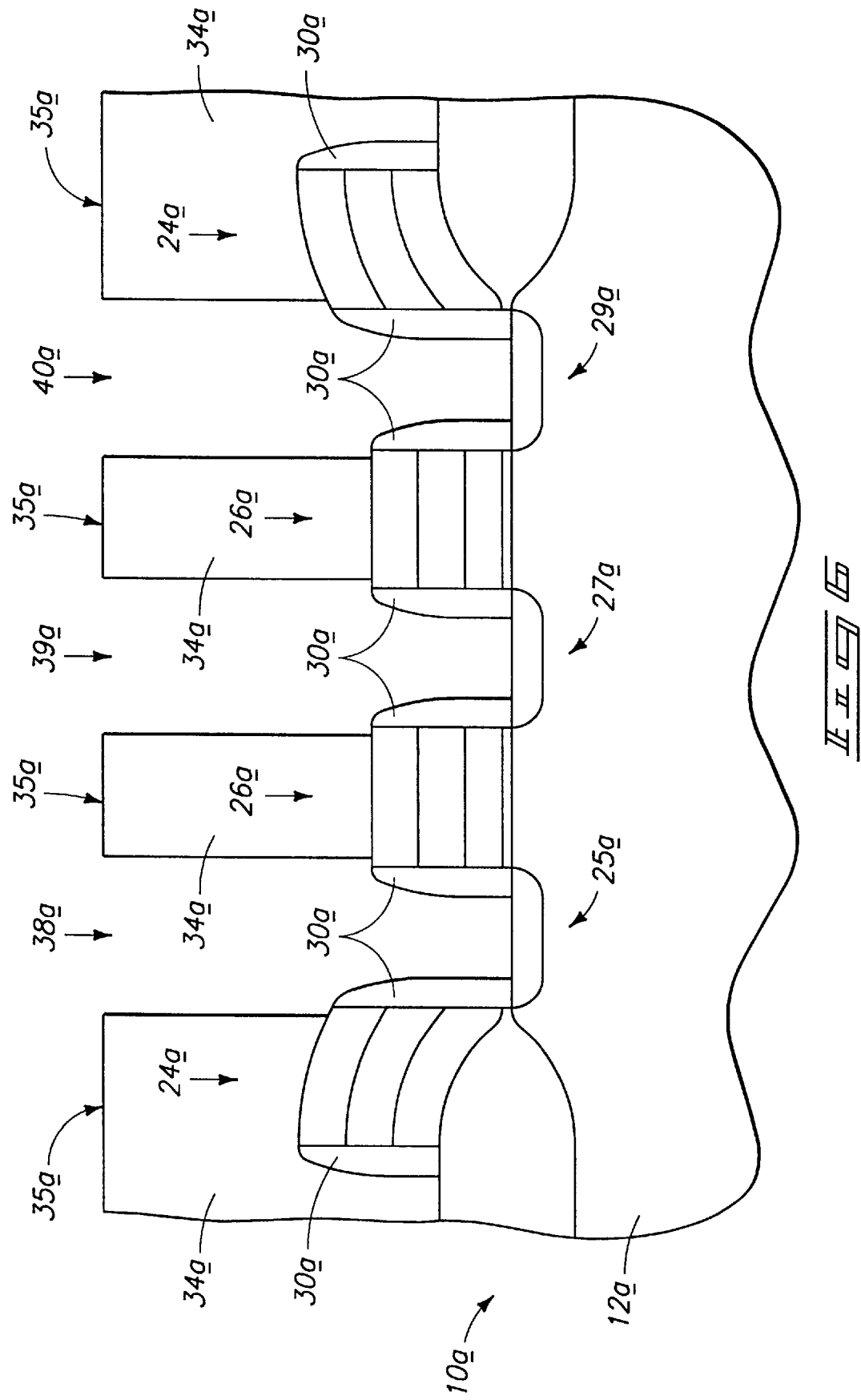
FIG. 6 is a view of the FIG. 2 wafer fragment at a processing step subsequent to that of FIG. 5.

Referring to FIG. 6, an insulative material layer 34a is formed over material 12a and over wordlines 24a and 26a. Insulative layer 34a may comprise, for example, BPSG, and can be formed by conventional methods. Insulative layer 34a comprises an upper surface 35a. Openings 38a, 39a and 40a are formed extending through insulative layer 34a to node locations 25a, 27a and 29a, respectively.

Figure 7:
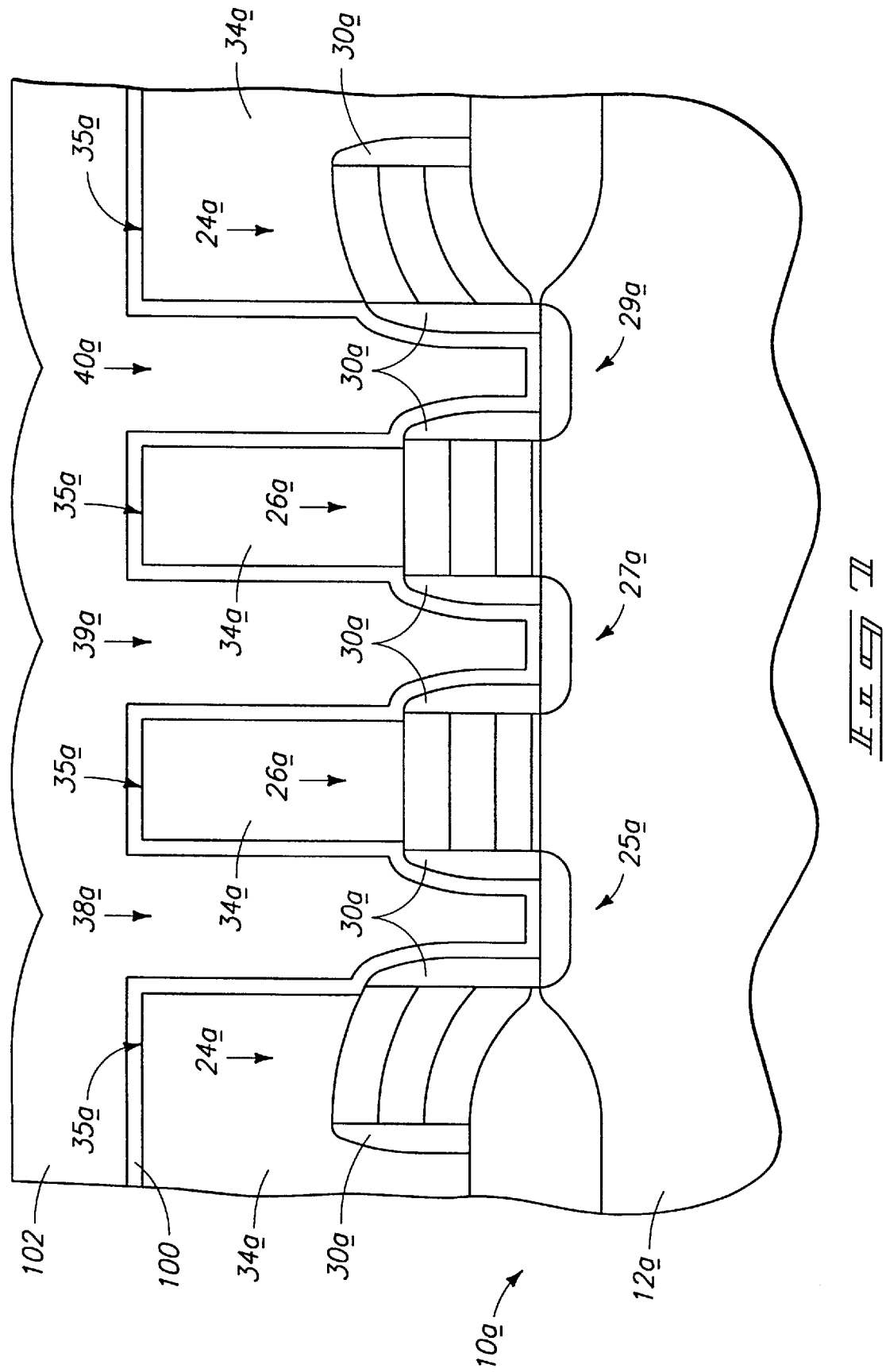
FIG. 7 is a view of the FIG. 2 wafer fragment at a processing step subsequent to that of FIG. 6.

Referring to FIG. 7, an undoped silicon layer 100 is formed over insulative layer 34a and within openings 38a, 39a and 40a. Undoped silicon layer 100 narrows openings 38a, 39a and 40a, but does not fill such openings. Undoped silicon layer 100 preferably has a thickness of from about 50 Angstroms to about 1000 Angstroms, with a thickness of about 300 Angstroms being most preferred. Undoped silicon layer 100 preferably comprises substantially amorphous silicon. Such substantially amorphous layer can be 5–10% crystalline. Undoped silicon layer 100 can be formed by conventional methods, such as, for example, by deposition utilizing either silane or disilane. For purposes of the continuing discussion, and for interpreting the claims that follow, "undoped" silicon is defined as silicon having a dopant concentration of less than $5 \times 10_{18}$ atoms/cm$^3$, and "doped" silicon is defined as silicon having a dopant concentration of at least $5 \times 10^{18}$ atoms/cm$^3$. "Undoped" silicon preferably comprises less than or equal to $1 \times 10^{18}$ atoms/cm$^3$, and "doped" silicon preferably comprises at least $1 \times 10^{19}$ atoms/cm$^3$.

A doped silicon layer 102 is formed over undoped silicon layer 100 and within openings 38a, 39a and 40a. In the shown embodiment of the invention, doped layer 102 completely fills openings 38a, 39a and 40a. However, in alternative embodiments of the invention, such as the embodiment discussed below with reference to FIGS. 14–17, layer 102 can only partially fill openings 38a, 39a and 40a. As will be appreciated by persons of ordinary skill in the art, the thickness of layer 102 will vary depending on whether layer 102 is chosen to completely fill openings 38a, 39a and 40a, or to partially fill such openings. Doped silicon layer 102 preferably comprises doped polysilicon, and can be formed by conventional methods.

After formation of layers 100 and 102, an upper surface of wafer fragment 10a is planarized to remove layers 100 and 102 from over insulative layer 34a. Such planarization can be accomplished by, for example, chemical-mechanical polishing (CMP).

Figure 8:
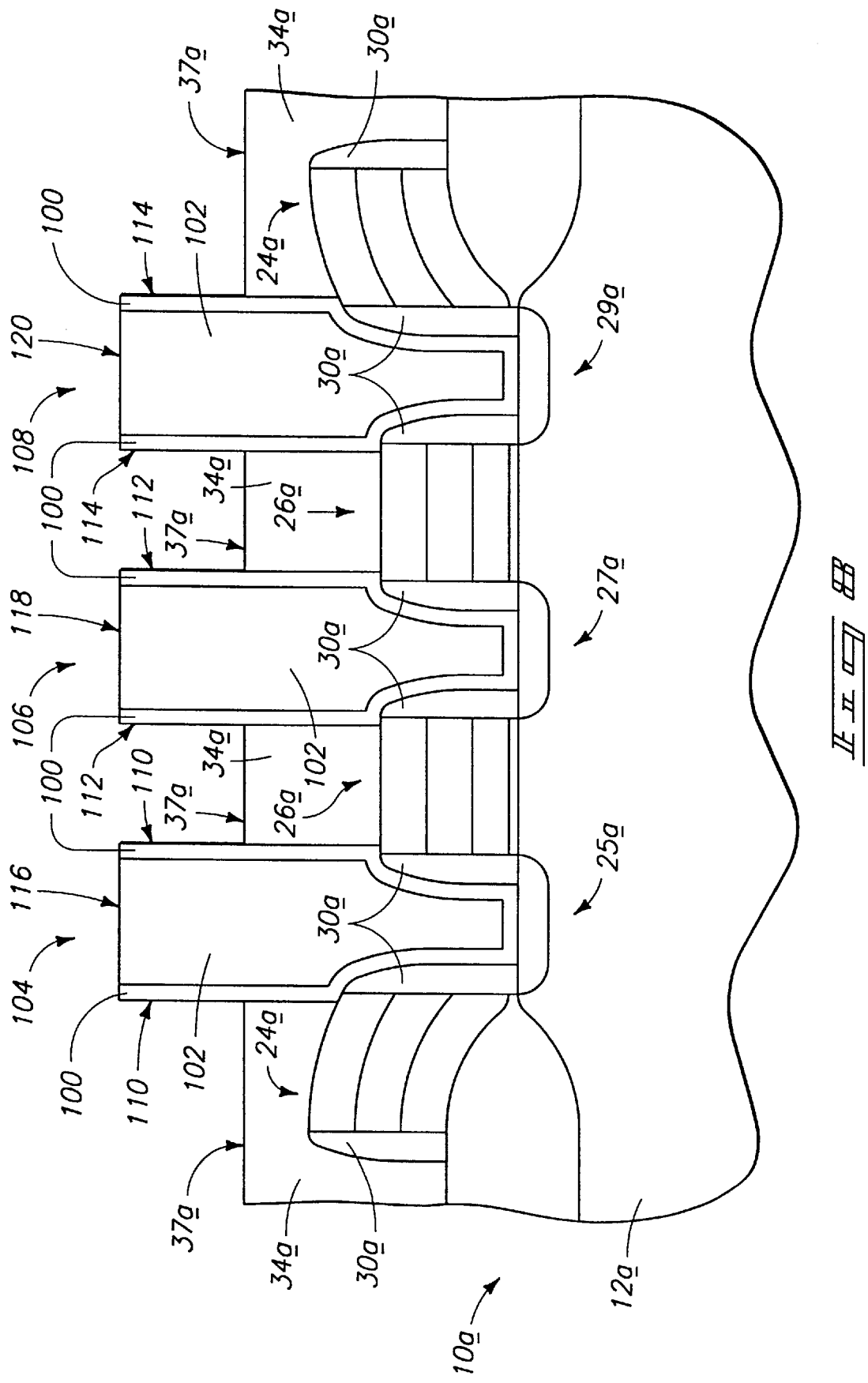
FIG. 8 is a view of the FIG. 2 wafer fragment at a processing step subsequent to that of FIG. 7

Referring to FIG. 8, after the above-discussed planarization, pedestals 104, 106 and 108 remain in openings 38a, 39a and 40a (shown in FIG. 7), respectively. Pedestals 104, 106 and 108 comprise undoped silicon layer 100 and doped silicon layer 102, and are over node locations 25a, 27a and 29a, respectively. Pedestals 104, 106 and 108 also comprise exposed upper surfaces 116, 118 and 120, respectively.

Figure 9:
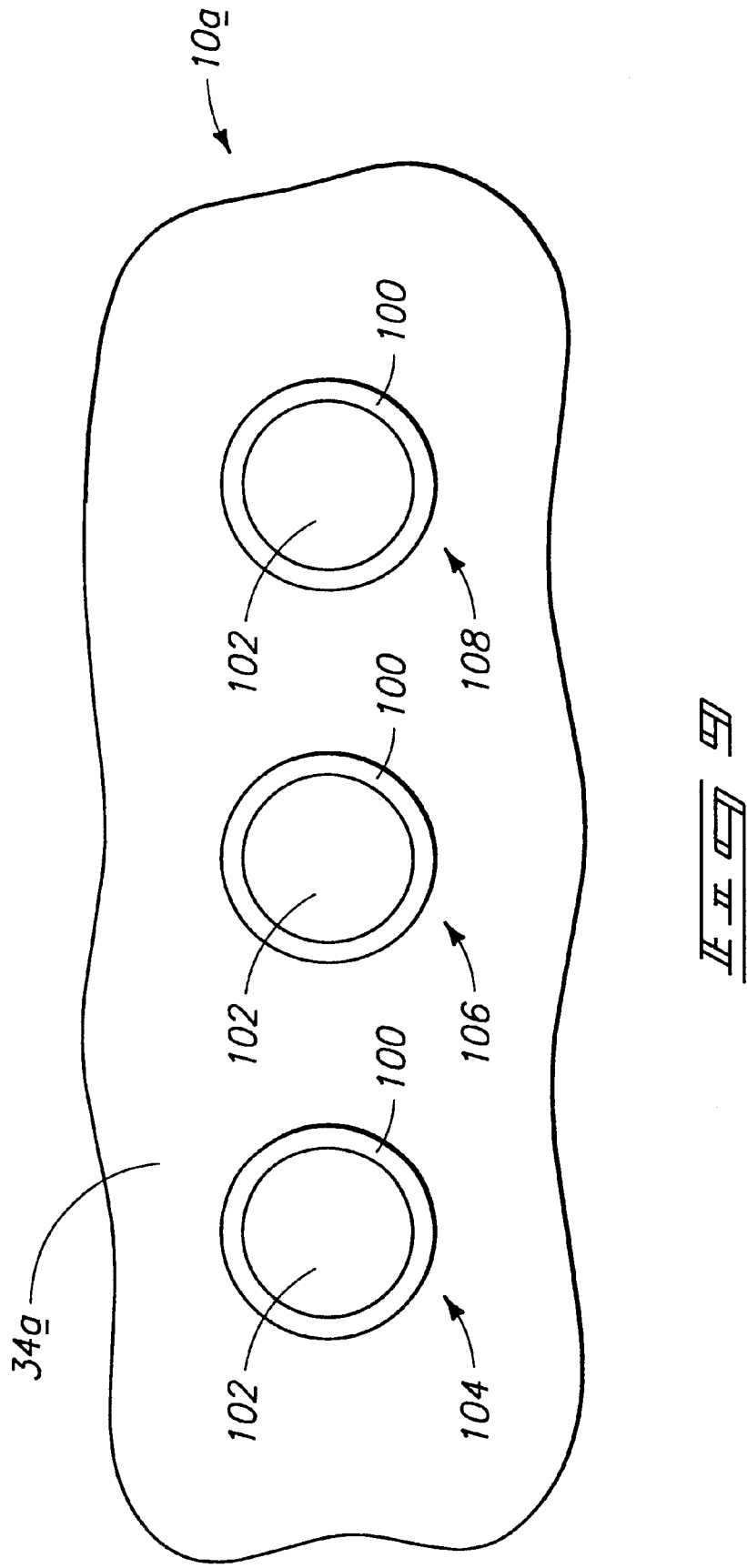
FIG. 9 is a top view of the FIG. 8 wafer fragment.

FIG. 9 illustrates a top view of the FIG. 8 wafer fragment, and shows that pedestals 104, 106 and 108 actually comprise a core of doped silicon layer 102 surrounded by undoped silicon layer 100.

Referring again to FIG. 8, insulative layer 34a is selectively removed relative to the silicon of pedestals 104, 106 and 108 to form a new upper surface 37a lower than previous upper surface 35a (shown in FIG. 7). The preferred BPSG insulative layer 34a can be selectively removed relative to pedestals 104, 106 and 108 using a conventional oxide etch. The selective removal of insulative layer 34a exposes a sidewall surface 110 of pedestal 104, a sidewall surface 112 of pedestal 106, and a sidewall surface 114 of pedestal 108. Sidewall surfaces 110, 112 and 114 comprise undoped silicon layer 100. Additionally, in the shown embodiment a portion of undoped silicon layer 100 is below upper surface 37a of BPSG layer 34a, and remains unexposed. The depth of removal of insulative layer 34a can be controlled by a number of methods. For example, layer 34a could be removed via a timed etch. As another example, an etch stop layer could be formed within layer 34a at a desired depth of surface 37a. An example of a layer 34a comprising an etch stop layer is a layer comprising BPSG and having, a silicon nitride etch stop layer formed within the BPSG at a level of upper surface 37a.

As exposed sidewall surfaces 110, 112 and 114 of pedestals 104, 106 and 108 comprise undoped silicon layer 100, and as exposed upper surfaces 116, 118 and 120 of the pedestals comprise exposed doped silicon layer 102, as well as exposed undoped silicon layer 100, the pedestals comprise exposed doped silicon and exposed undoped silicon at the processing step of FIG. 8.

Figure 10:
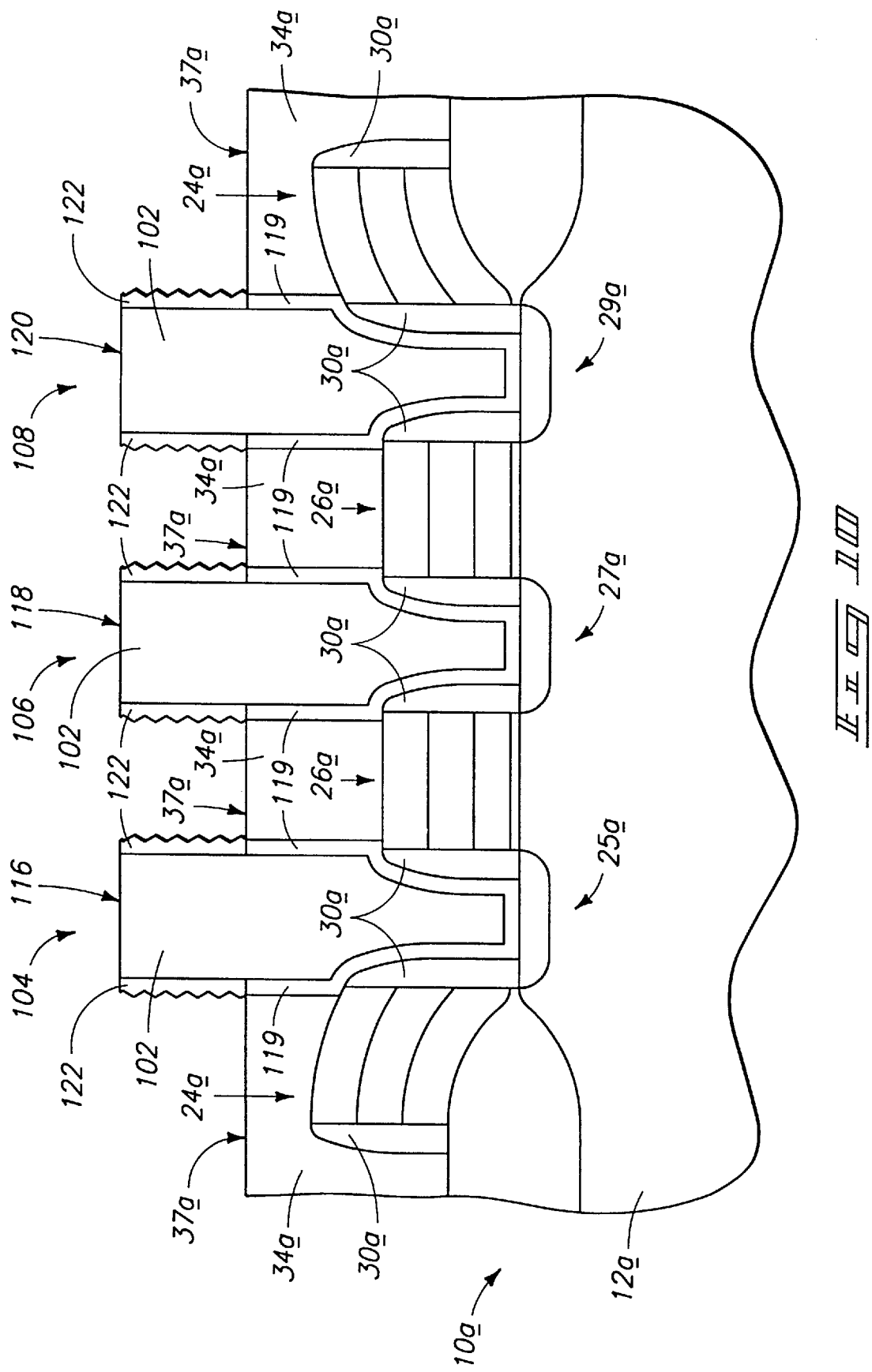
FIG. 10 is a view of the FIG. 2 wafer fragment at a processing step subsequent to that of FIG. 8.

Referring to FIG. 10, a rugged polysilicon layer 122 is substantially selectively formed from the exposed undoped silicon of surfaces 110, 112 114, 116, 118, and 120 (shown in FIG. 8), and not from the exposed doped silicon of surfaces 116, 118 and 120. Rugged polysilicon layer 122 comprises materials selected from the group consisting of HSG and cylindrical grain polysilicon. The substantially selective formation of a preferred HSG polysilicon layer 122 from undoped silicon surfaces but not from doped silicon surfaces can be accomplished by the following process.

First, wafer fragment 10a is loaded into a conventional chemical vapor deposition (CVD) furnace and is subjected to an in situ hydrofluoric acid (HF) clean to remove native oxide. The in situ HF clean preferably comprises a flow rate of 85 standard cubic centimeters per minute (sccm) of HF gas and 8500 sccm of $H_2O$ gas, at a pressure of 15 Torr, for a time of about 20 seconds. Wafer fragment 10a is then exposed to silane to form amorphous silicon seeds on the undoped silicon. Wafer fragment 10a is then annealed for approximately 20 minutes at about 560° C. The seeding and anneal steps convert undoped amorphous silicon into rugged polysilicon (such as hemispherical grain polysilicon), while leaving exposed doped silicon layers not converted to rugged polysilicon. It is noted that the above-described process for forming HSG polysilicon does not require disilane, and hence is different than the "pure" selective hemispherical grain deposition utilized in high vacuum tools with disilane.

After the formation of rugged polysilicon layer 122, a short polysilicon etch is performed to remove any monolayers of silicon deposited on insulative layer 34a during the above-described seeding step. Such polysilicon etch can be accomplished with conventional conditions, and may comprise either a wet etch or a dry etch.

The above-described process for forming rugged polysilicon layer 122 advantageously avoids formation of polysilicon on a back side (not shown) of wafer fragment 10a. The method can also avoid double bit failures by removing monolayers of silicon after formation of HSG.

Subsequent thermal processing of pedestals 104, 106 and 108 can out-diffuse dopant from doped polysilicon layer 102 into undoped silicon layer 100 (shown in FIG. 8), to convert unexposed portions of undoped silicon layer 100 into a doped polysilicon layer 119. Subsequent thermal processing can also out-diffuse dopant from doped polysilicon layer 102 into rugged polysilicon layer 122. Thermal processing to out-diffuse dopant from doped polysilicon layer 102 into adjacent undoped layers will typically comprise temperatures of 800° C. or greater.

Figure 11:
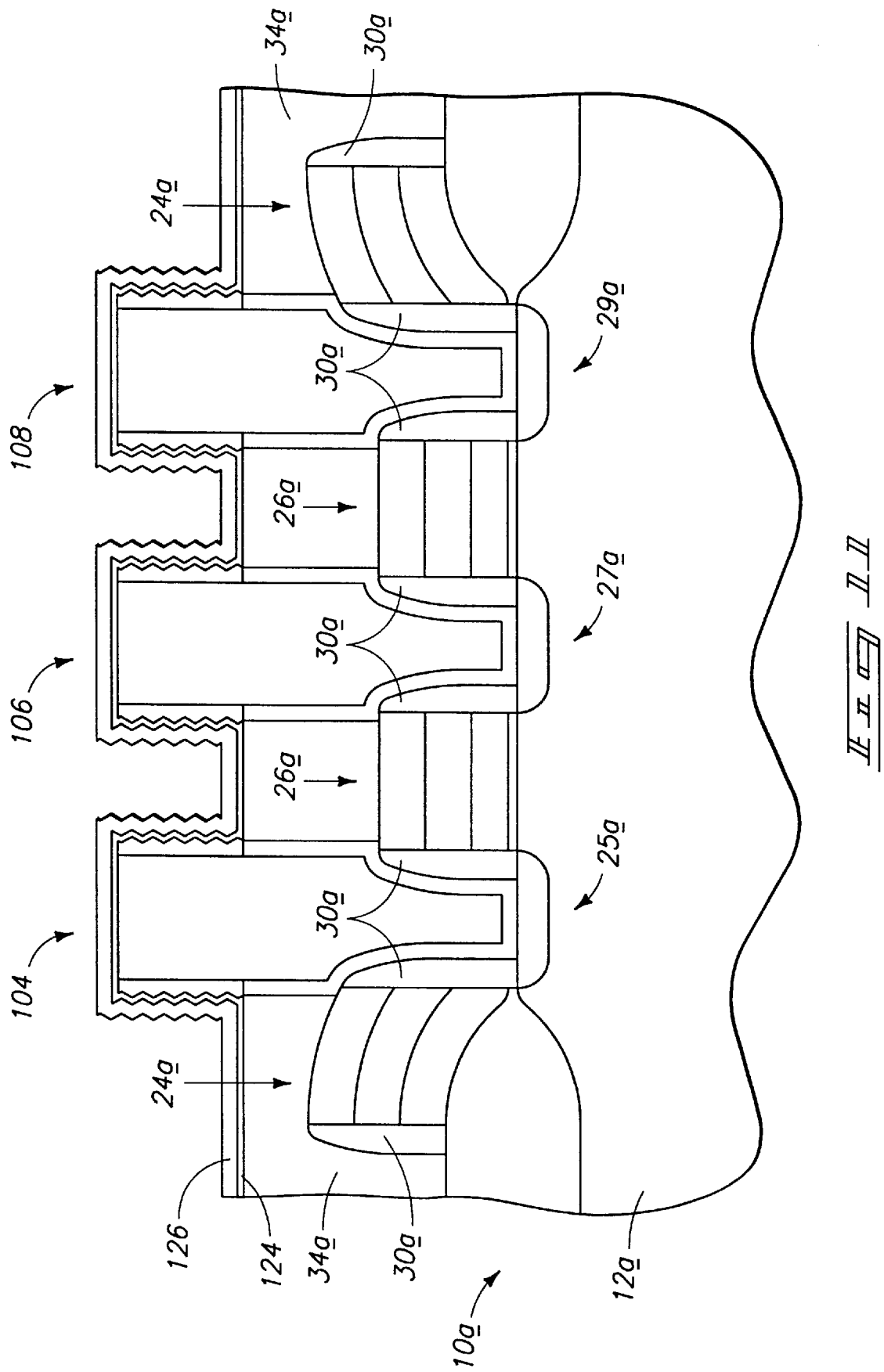
FIG. 11 is a view of the FIG. 2 wafer fragment at a processing step subsequent to that of FIG. 10.

Referring to FIG. 11, a dielectric layer 124 is provided over insulative layer 34a and over pedestals 104, 106 and 108. Dielectric layer 124 will typically comprise silicon nitride and or silicon oxide, although other suitable materials are known to persons of skill in the art. A capacitor cell plate layer 126 is provided over dielectric layer 124. Capacitor cell plate layer 126 will typically comprise doped polysilicon, but other suitable materials are known to persons of skill in the art.

Figure 12:
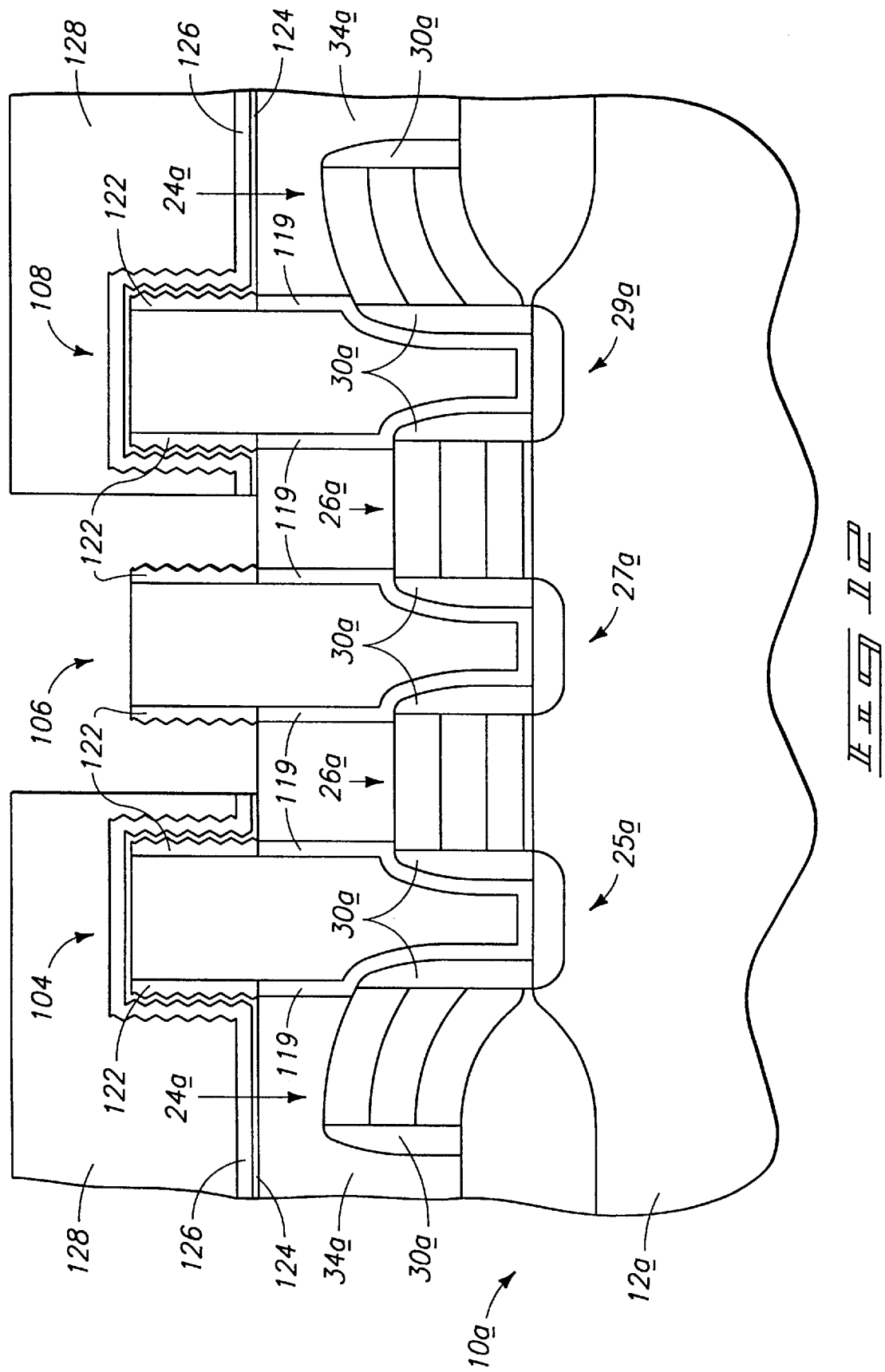
FIG. 12 is a view of the FIG. 2 wafer fragment at a processing step subsequent to that of FIG. 11.

Referring to FIG. 12, a patterned masking layer 128 is formed over pedestals 104 and 108, leaving pedestal 106 exposed. Subsequently, wafer fragment 10a is subjected to etching conditions which remove cell plate layer 126 and dielectric layer 124 from proximate pedestal 106. After such etching, pedestal 106 is electrically isolated from pedestals 104 and 108, with the only remaining electrical connection between pedestal 106 and pedestals 104 and 108 being through wordlines 26a. Methods for removing cell plate layer 126 and dielectric layer 124 from proximate pedestal 106 are known to persons of ordinary skill in the art.

Figure 13:
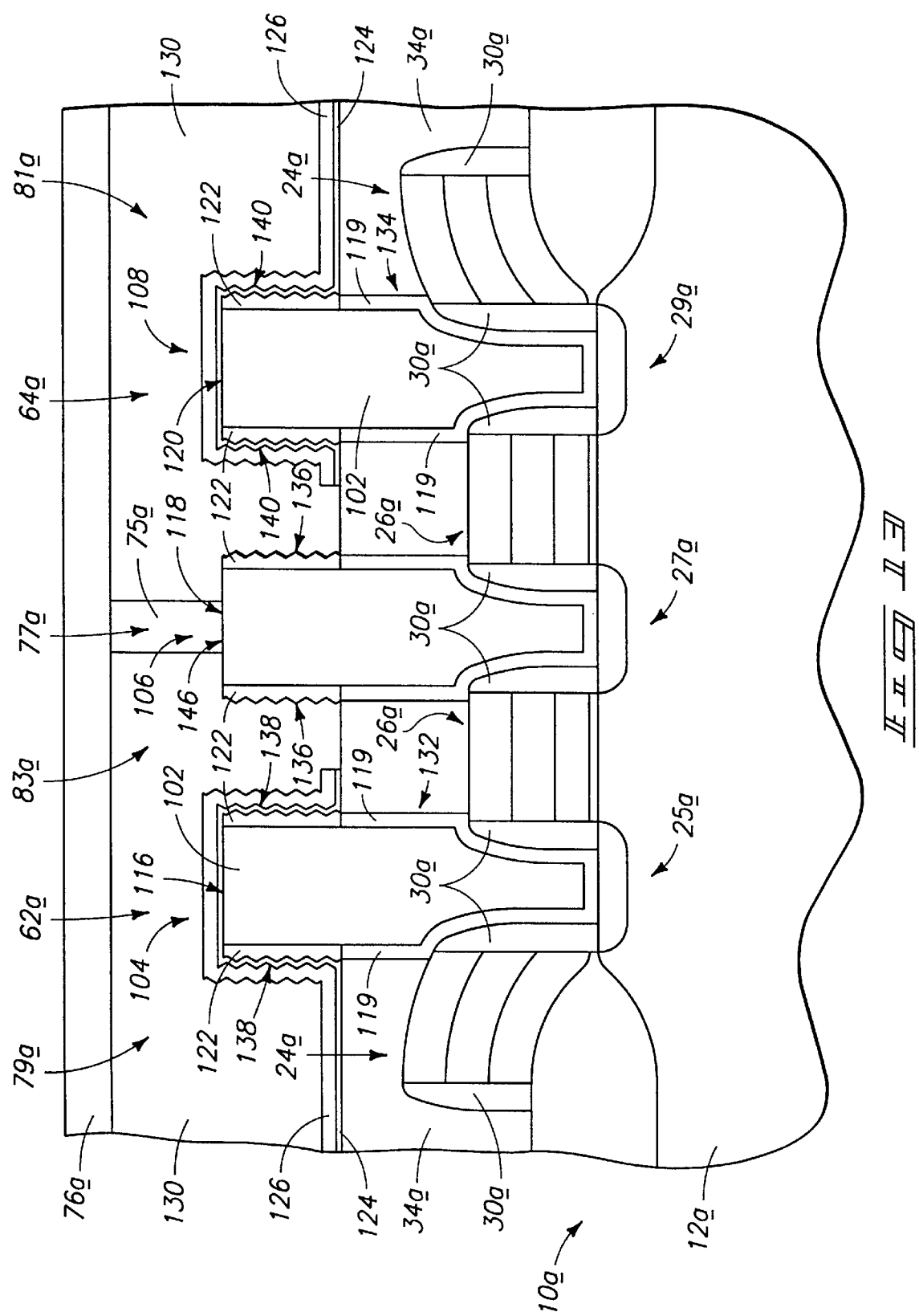
FIG. 13 is a view of the FIG. 2 wafer fragment at a processing step subsequent to that of FIG. 12.

Referring to FIG. 13, masking layer 128 is removed and an insulative layer 130 is formed over pedestals 104, 106 and 108, and over insulative layer 34a. Insulative layer 130 may comprise, for example, BPSG, and can be formed by conventional methods. A conductive bitline plug 75a is formed extending through insulative layer 130 and in electrical contact with pedestal 106. Pedestal 106 comprises rugged lateral surfaces 136 and an upper surface 118 which has a predominant portion not comprising rugged-polysilicon. As shown, the non-rugged polysilicon of upper surface advantageously provides a smooth landing region for bitline plug 75a.

Pedestal 106 and bitline plug 75a together form a bitline contact 77a. A bitline 76a is formed over bitline plug 75a and in an electrical connection with pedestal 106 through bitline plug 75a. Bitline 76a and bitline plug 75a may be formed by conventional methods.

The above-describe method can be used to avoid chemical-mechanical polishing of a rugged polysilicon layer, thus avoiding a potential source of double bit failures.

FIG. 13 illustrates a DRAM array 83a of the present invention. DRAM array 83a comprises capacitors 62a and 64a. Capacitors 62a and 64a comprise capacitor storage nodes 132 and 134, respectively, which comprise doped polysilicon layer 102, doped polysilicon layer 119 and rugged-polysilicon layer 122. As the doped polysilicon layer 119 is formed from the undoped silicon layer 100 (shown in FIG. 8), the undoped silicon layer 100 and doped silicon layer 102 of pedestals 104 and 108 in FIG. 8 together define capacitor storage nodes 132 and 134. Storage nodes 132 and 134 have rugged-polysilicon-comprising lateral surfaces 138 and 140, respectively. Storage nodes 132 and 134 further comprise top surfaces 116 and 120, respectively, which have predominant portions which do not comprise rugged-polysilicon.

Cell plate layer 126 and dielectric layer 124 are operatively proximate to storage nodes 132 and 134 so that the storage nodes, together with cell plate layer 126 and dielectric layer 124, form operative capacitors 62a and 64a. Dielectric layer 124 contacts rugged surfaces 138 and 140, as well as top surfaces 116 and 120 of storage nodes 132 and 134.

Capacitors 62a and 64a are connected to pedestal 106 through wordlines 26a. Capacitor 62a, together with bitline contact 77a and an interconnecting wordline 26a, comprises a first DRAM cell 79a. Capacitor 64a, together with bitline contact 77a and an interconnecting wordline 26a, comprises a second DRAM cell 81a.

A second embodiment of the invention is described with reference to FIGS. 14–17. In describing the embodiment of FIGS. 14–17, numbering similar to that utilized above for describing the embodiment of FIGS. 2–13 is utilized, with differences being indicated by the suffix "b", or by different numbers.

Figure 14:
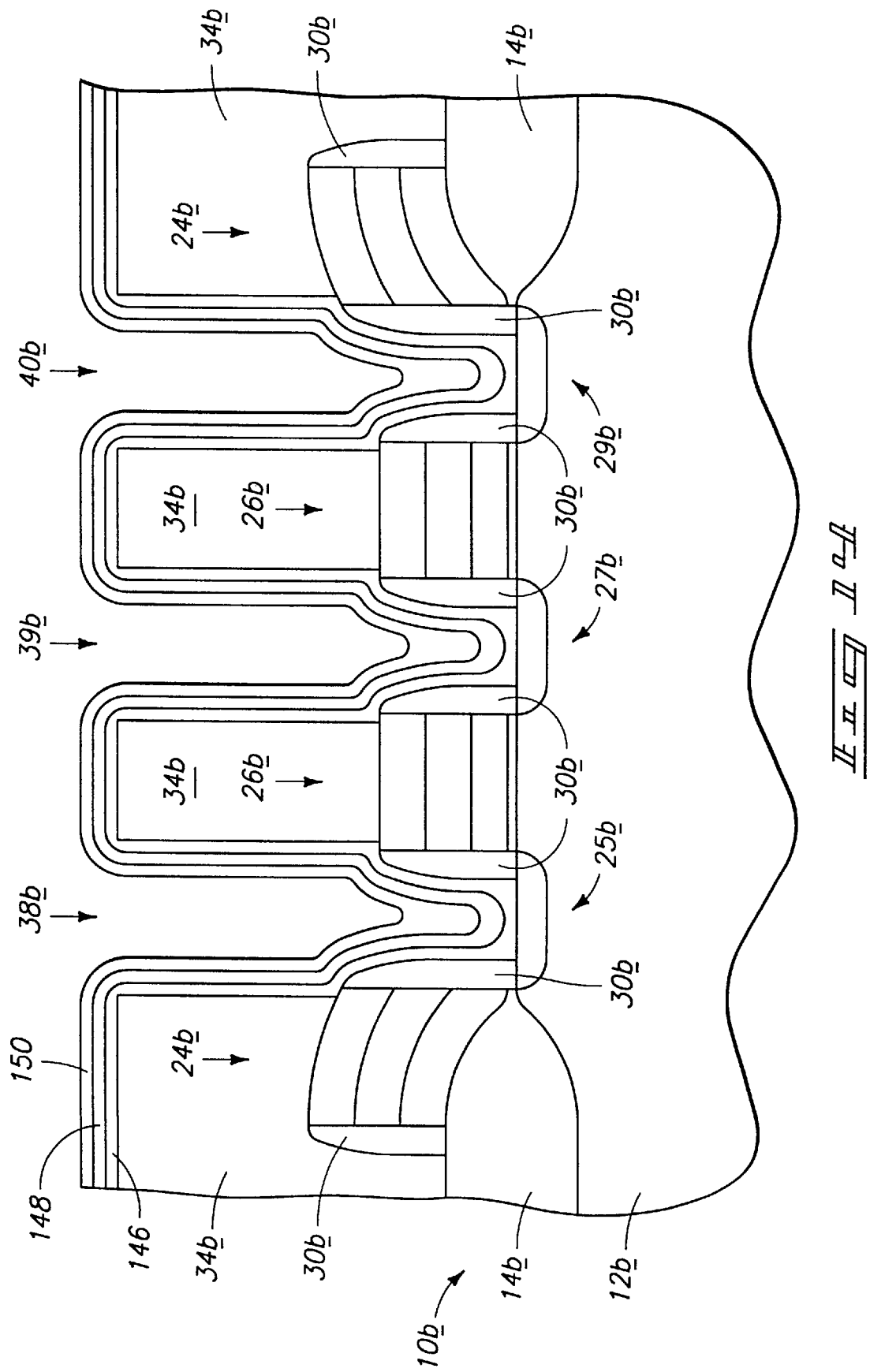
FIG. 14 is a view of the FIG. 2 wafer fragment at a processing step subsequent to that of FIG. 6 processed according to a second embodiment of the present invention.

Referring to FIG. 14, a wafer fragment 10b is shown at a processing step subsequent to that of the above-discussed FIG. 6. Wafer fragment 10b comprises wordlines 24b and 26b having constructions identical to that discussed above with regard to the prior art. Wafer fragment 10b further comprises node locations 25b, 27b and 29b between wordlines 24b and 26b. Wafer fragment 10b also comprises a semiconductor substrate 12b and field oxide regions 14b formed over substrate 12b.

An insulative material layer 34b is formed over wordlines 24b and 26b, and over semiconductive material 12b. Insulative layer 34b may comprise a number of materials known to persons of ordinary skill in the art, including BPSG. Openings 38b, 39b and 40b extend through insulative layer 34b to node locations 25b, 27b and 29b, respectively.

A first undoped silicon layer 146 extends over insulative layer 34b and within openings 38b, 39b and 40b. Undoped silicon layer 146 preferably comprises amorphous silicon, and preferably has a thickness of from about 50 Angstroms to about 500 Angstroms. Undoped silicon layer 146 can be formed by conventional methods, such as CVD. Undoped silicon layer 146 narrows openings 38b, 39b and 40b.

A doped silicon layer 148 is formed over undoped silicon layer 146 and within narrowed openings 38b, 39b and 40b. Doped silicon layer 148 preferably comprises polysilicon, and can be formed by conventional methods, such as CVD. Doped silicon layer 148 preferably has a thickness of from about 50 Angstroms to about 500 Angstroms, and preferably does not fill openings 38b, 39b and 40b. Rather, doped silicon layer 148 preferably further narrows openings 38b, 39b and 40b beyond where openings 38b, 39b and 40b were narrowed by undoped silicon layer 146.

A second undoped silicon layer 150 is formed over doped silicon layer 148 and within openings 38b, 39b and 40b. Undoped silicon layer 150 preferably comprises the same preferable materials of first undoped silicon layer 146. Accordingly, second undoped silicon layer 150 preferably comprises substantially amorphous silicon. Second undoped silicon layer 150 preferably has a thickness of from 50 to 500 Angstroms, and in the shown preferred embodiment does not fill openings 38b, 39b and 40b.

After formation of layers 146, 148 and 150, wafer fragment 10b is planarized to remove layers 146. 148 and 150 from over insulative layer 34b. Such planarizing may be accomplished by, for example, chemical-mechanical polishing. After the planarization of wafer fragment 10b, pedestals 104b, 106b and 108b (shown in FIG. 15) having upper surfaces 116b, 118b and 120b (shown in FIG. 15), respectively, remain within openings 38b, 39b and 40b.

Figure 15:
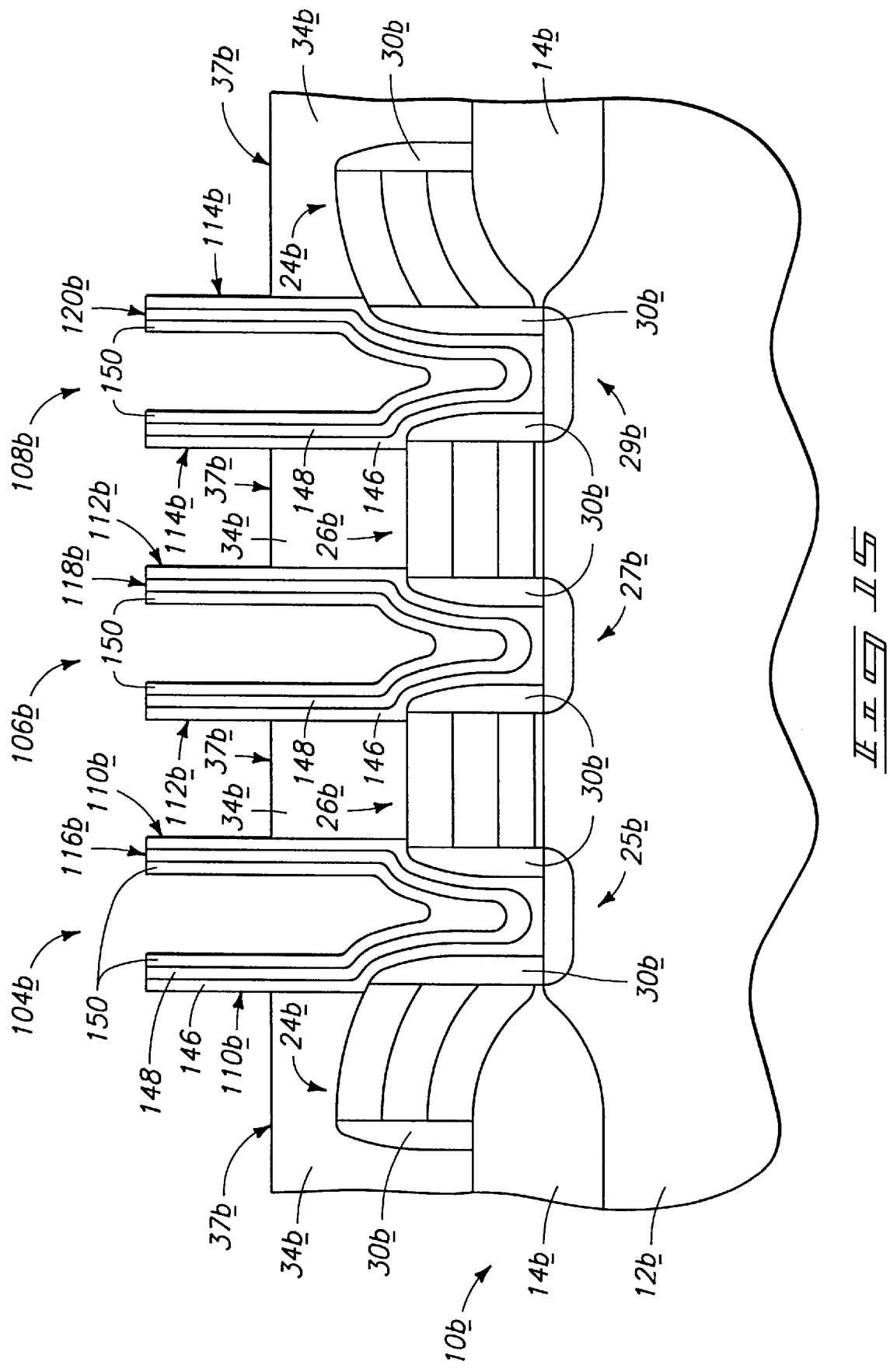
FIG. 15 is a view of the FIG. 2 wafer fragment at a step subsequent to that of FIG. 14.

Referring to FIG. 15, the material of insulative layer 34b is selectively removed relative to the silicon of pedestals 104b, 106b and 108b to form an upper surface 37b of insulative layer 34b which is below upper surfaces 116b, 118b and 120b of pedestals 104b, 106b and 108b. The removal of insulative layer 34b exposes sidewalls 110b, 112b and 114b of pedestals 104b, 106b and 108b, respectively. The exposed sidewalls 110b, 112b and 114b comprise first undoped silicon layer 146. Additionally, in the shown embodiment a portion of undoped silicon layer 146 is below upper surface 37b of BPSG layer 34b, and remains unexposed. In the shown preferred embodiment, pedestals 104b, 106b and 108b comprise hollow interiors corresponding to openings 38b, 39b and 40b (shown in FIG. 14). The depth of removal of insulative layer 34b can be controlled by methods such as those discussed above with reference to FIG. 8 for controlling the depth of removal of insulative layer 34a.

Figure 16:
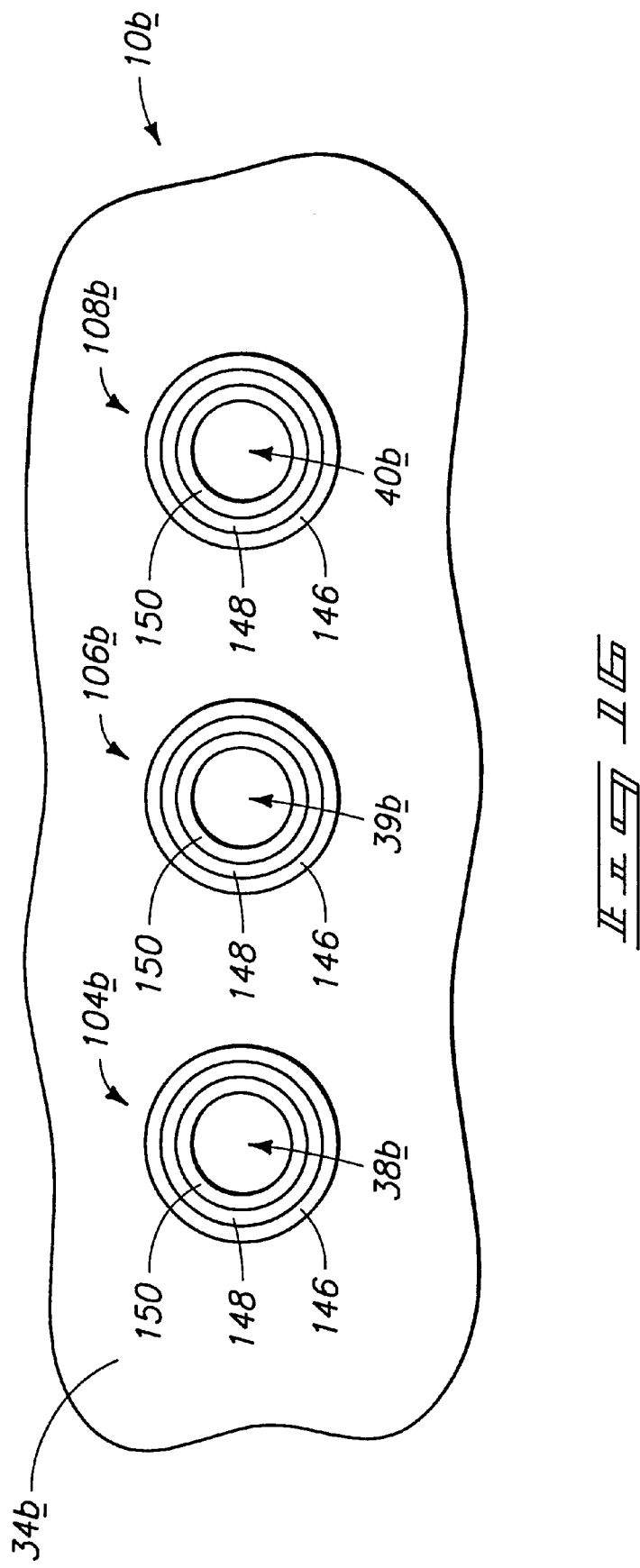
FIG. 16 is a top view of the FIG. 15 wafer fragment.

Referring to FIG. 16, which is a top view of the FIG. 15 wafer fragment, second undoped silicon layer 150 lines the hollow interiors corresponding to openings 38b, 39b and 40b.

Figure 17:
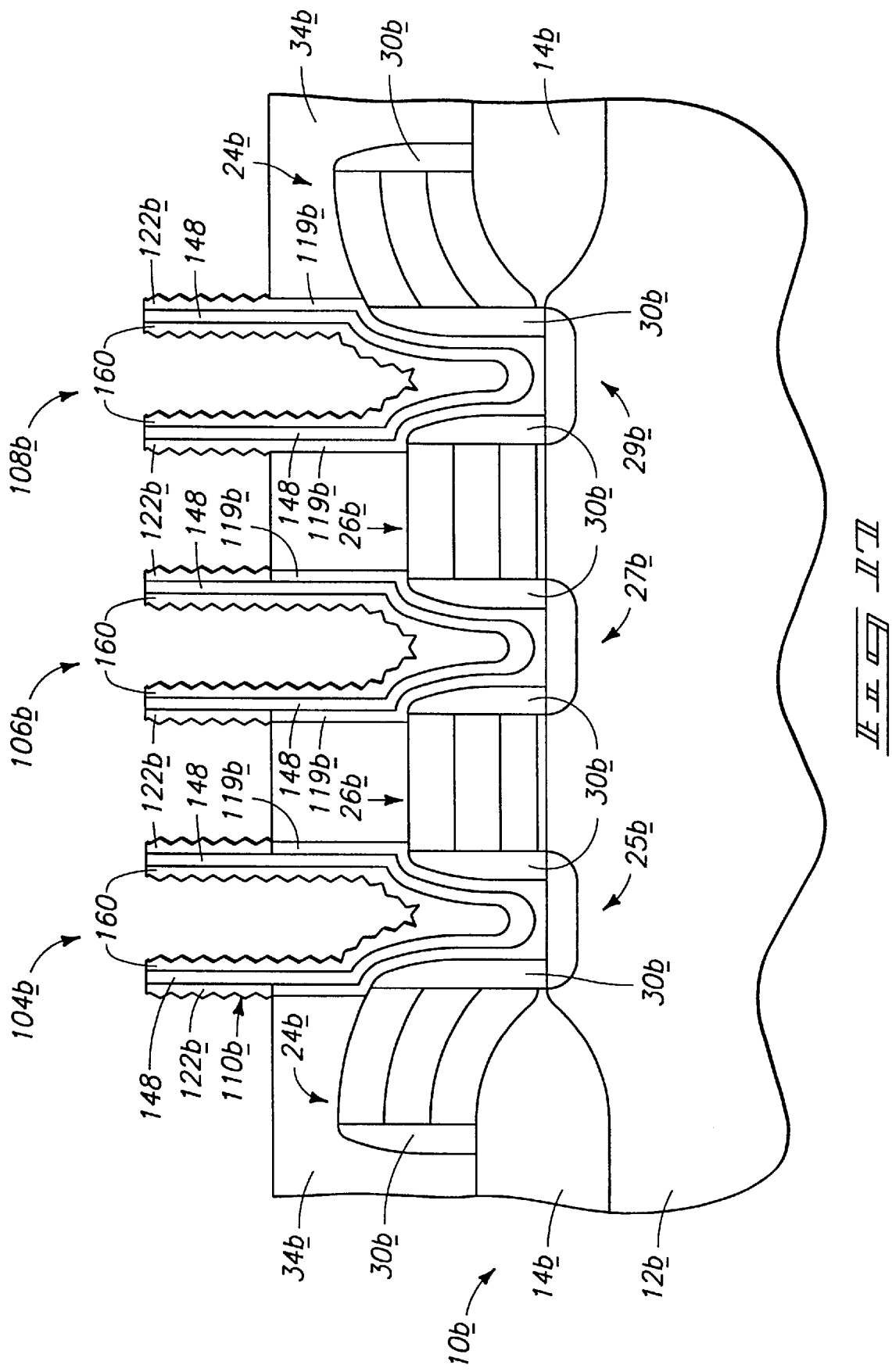
FIG. 17 is a view of the FIG. 2 wafer fragment at a step subsequent to that of FIG. 15.

Referring to FIG. 17, wafer fragment 10b is subjected to processing identical to that discussed above regarding FIG. 10 to convert exposed undoped silicon surfaces to rugged-polysilicon surfaces, while not roughening exposed doped silicon surfaces. Such treatment forms a rugged-polysilicon layer 122b from exposed portions of first undoped silicon layer 146 (shown in FIG. 15) and forms a rugged-polysilicon layer 160 from second undoped silicon layer 150 within the interiors of pedestals 104b, 106b and 108b. Such processing also out-diffuses dopant from doped silicon layer 148 into adjacent undoped layers and thus converts unexposed portions of undoped layer 146 (shown in FIG. 15) into doped regions 119b.

Subsequent processing, similar to the processing discussed above with reference to FIGS. 11–13, may be conducted to form a DRAM array from pedestals 104b, 106b and 108b. In such DRAM array, pedestals 104b and 108b would be storage nodes for first and second capacitors, respectively, and pedestal 106b would form a conductive contact to a bitline. Such subsequent processing is not illustrated as the description above regarding FIGS. 11–13 is sufficient to enable a person of skill in the art to form a DRAM array from the structure of FIG. 17. It is noted, however, that the storage nodes formed from pedestals 104b and 108b would differ from the storage nodes of FIG. 13 in that the storage nodes formed from pedestals 104b and 108b would have the shape of upwardly open containers, with the interiors of such containers being lined by rugged-polysilicon layer 160.

The above-described DRAMs and capacitors of the present invention can be implemented into monolithic integrated circuitry, including microprocessors.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising the following steps:

forming a capacitor plate, forming a capacitor plate comprising:

forming a solid mass of silicon material within an opening formed over a node location defined by a doped region of the semiconductor substrate, the mass comprising two forms of silicon, the mass including undoped silicon in physical contact with the node location; and substantially selectively forming rugged polysilicon from one of the forms of silicon and not from another of the forms of silicon; and forming a cell plate proximate the rugged polysilicon.

2. The method of claim 1 wherein the two forms of silicon comprise doped silicon and undoped silicon.

3. The method of claim 2 wherein the doped silicon comprises a dopant concentration of at least $5 \times 10^{18}$ atoms/cm$^3$ and wherein the undoped silicon comprises a dopant concentration of less than $5 \times 10^{18}$ atoms/cm$^3$.

4. The method of claim 2 wherein the doped silicon comprises a dopant concentration of at least $1 \times 10^{19}$ atoms/cm$^3$ and wherein the undoped silicon comprises a dopant concentration of less than or equal to $1 \times 10^{18}$ atoms/cm$^3$.

5. A method of forming a capacitor comprising the following steps:
   forming a solid mass of silicon material filling an opening formed over a node location defined by a doped region of the semiconductor substrate, the mass comprising exposed doped silicon and exposed undoped silicon, and including undoped silicon in contact with the node location;
   substantially selectively forming rugged polysilicon from the exposed undoped silicon and not from the exposed doped silicon; and
   forming a cell plate proximate the rugged polysilicon.

6. The method of claim 5 wherein the step of forming a mass of silicon material comprises forming a layer of doped silicon between two layers of undoped silicon.

7. The method of claim 5, further comprising conductively doping the undoped silicon after forming the rugged polysilicon.

8. The method of claim 5, further comprising, after forming the rugged polysilicon, out-diffusing impurity from the doped silicon into the undoped silicon to conductively dope the undoped silicon.

9. The method of claim 5 wherein the step of forming the mass comprises forming the exposed undoped silicon to be substantially amorphous.

10. The method of claim 5 wherein the step of forming the mass comprises forming the exposed doped silicon to be substantially polycrystalline.

11. A method of forming a capacitor comprising the following steps:
    forming an insulative layer over a node location defined by a doped region;
    forming an opening through the insulative layer to the node location;
    forming two forms of silicon within the opening, the two forms of silicon together forming a capacitor storage node, the two forms of silicon including undoped silicon in contact with the node location;
    exposing the two forms of silicon to common subsequent processing conditions which substantially selectively form rugged polysilicon from one of the exposed two forms of silicon and not from another of the exposed two forms of silicon; and
    forming a cell plate proximate the storage node.

12. The method of claim 11 wherein the two forms of silicon comprise doped silicon and undoped silicon.

13. A method of forming a capacitor comprising the following steps:
    forming an insulative layer over a node location defined by a doped region;
    forming an opening through the insulative layer to the node location;
    forming silicon material within the opening, the silicon material comprising doped silicon and undoped silicon and defining a capacitor storage node, a portion of the undoped silicon being in physical contact with the node location;
    removing a portion of the insulative layer to expose a sidewall surface of the storage node, the exposed sidewall surface comprising undoped silicon;
    forming HSG from the undoped silicon of the exposed sidewall surface; and
    forming a cell plate proximate the storage node.

14. The method of claim 13 wherein the doped silicon comprises polysilicon and the undoped silicon comprises substantially amorphous silicon.

15. The method of claim 13 wherein the step of forming the silicon material comprises forming a layer of doped silicon between two layers of undoped silicon.

16. The method of claim 13 wherein the step of forming the silicon material comprises forming a layer of doped polysilicon between two layers of undoped substantially amorphous silicon.

17. A method of forming a capacitor comprising the following steps:
    forming an insulative layer over a node location defined by a doped region;
    forming an opening through the insulative layer to the node location;
    forming an undoped silicon layer within the opening to narrow the opening, a portion of the undoped silicon contacting the node location;
    forming a doped silicon layer within the narrowed opening, the undoped silicon layer and doped silicon layer together defining a capacitor storage node; and
    forming a cell plate proximate the storage node.

18. The method of claim 17 wherein the undoped silicon layer comprises substantially amorphous silicon.

19. The method of claim 17 wherein the doped silicon layer comprises polysilicon.

20. The method of claim 17 further comprising:
    removing a portion of the insulative layer to expose a sidewall surface of the storage node comprising the undoped silicon layer; and
    forming rugged polysilicon from the exposed sidewall surface.

21. The method of claim 17 further comprising:
    exposing a surface of the capacitor storage node comprising undoped silicon;
    exposing a surface of the capacitor storage node comprising doped silicon; and
    substantially selectively forming HSG polysilicon from the exposed capacitor storage node surface comprising undoped silicon and not from the exposed capacitor storage node surface comprising doped silicon.

22. The method of claim 21 wherein the formation of the rugged polysilicon comprises:
    in situ HF cleaning of the exposed sidewall surface;
    seeding the exposed sidewall surface with polysilicon; and
    annealing the seeded sidewall surface at about 560° C. for about 20 minutes.

23. The method of claim 21 wherein the formation of the rugged polysilicon comprises:
    in situ HF cleaning of the exposed sidewall surface;
    seeding the exposed sidewall surface with polysilicon;
    annealing the seeded sidewall surface at about 560° C. for about 20 minutes; and
    a polysilicon etch after the annealing to remove any monolayers of silicon.

24. A method of forming a capacitor comprising the following steps:

forming an insulative layer over a node location defined by a doped region;

forming an opening through the insulative layer to the node location;

forming a first undoped silicon layer within the opening to narrow the opening, a portion of the undoped silicon layer contacting the node location;

forming a doped silicon layer within the narrowed opening to further narrow the opening;

forming a second undoped silicon layer within the further narrowed opening; the first undoped silicon layer, second undoped silicon layer and doped silicon layer together defining a capacitor storage node;

removing a portion of the insulative layer to expose a sidewall surface of the storage node comprising the first undoped silicon layer;

forming rugged polysilicon on the exposed sidewall surface; and forming a cell plate proximate the storage node.

25. The method of claim 24 further comprising:

exposing a surface of the capacitor storage node comprising the second undoped silicon layer;

exposing a surface of the capacitor storage node comprising the doped silicon layer; and substantially selectively forming HSG polysilicon from the exposed capacitor storage node surface comprising undoped silicon and not from the exposed capacitor storage node surface comprising doped silicon.

26. The method of claim 1, wherein forming a cell plate comprises forming a capacitor dielectric layer and a complementary capacitor plate proximate the rugged polysilicon.

27. The method of claim 5, wherein forming a cell plate comprises forming a capacitor dielectric layer and a complementary capacitor plate proximate the rugged polysilicon and doped silicon.

28. The method of claim 11, wherein forming a cell plate comprises:

forming a dielectric layer proximate the storage node; and forming a cell plate layer proximate the dielectric layer.

29. The method of claim 13, wherein forming a cell plate comprises:

forming a capacitor dielectric layer proximate the storage node; and forming a complementary capacitor plate proximate the capacitor dielectric layer.

30. The method of claim 17, wherein forming a cell plate comprises:

forming a capacitor dielectric layer proximate the storage node; and forming a complementary capacitor plate proximate the capacitor dielectric layer.

31. The method of claim 24, wherein forming a cell plate comprises:

forming a dielectric layer proximate the storage node; and forming a cell plate layer proximate the dielectric layer.

32. A method of forming a capacitor comprising:

forming an insulative layer over a node location;

forming an opening through the insulative layer to the node location;

filling the opening with silicon material, the silicon material comprising doped silicon and undoped silicon and defining a capacitor storage node;

removing a portion of the insulative layer to expose a sidewall surface of the storage node, the exposed sidewall surface comprising undoped silicon;

forming HSG from the undoped silicon of the exposed sidewall surface; and forming a cell plate proximate the storage node.

33. The method of claim 32, wherein forming a cell plate comprises:

forming a capacitor dielectric layer proximate the storage node; and forming a complementary capacitor plate proximate the capacitor dielectric layer.

34. The method of claim 32 wherein the doped silicon comprises polysilicon and the undoped silicon comprises substantially amorphous silicon.

35. The method of claim 32 wherein forming the silicon material comprises forming a layer of doped silicon inside a layer of undoped silicon.

36. The method of claim 32 wherein filling the opening with silicon material comprises forming a layer of doped polysilicon within a layer of undoped substantially amorphous silicon.

37. A method of forming a capacitor comprising:

forming an insulative layer over a node location;

forming an opening through the insulative layer to the node location;

forming an undoped silicon layer within the opening to narrow the opening;

filling the narrowed opening with a doped silicon layer, the undoped silicon layer and doped silicon layer together defining a capacitor storage node; and forming a cell plate proximate the storage node.

38. The method of claim 37, wherein forming a cell plate comprises forming a capacitor dielectric layer proximate the storage node; and forming a complementary capacitor plate proximate the capacitor dielectric layer.

39. The method of claim 37 further comprising:

exposing a surface of the capacitor storage node comprising undoped silicon;

exposing a surface of the capacitor storage node comprising doped silicon; and substantially selectively forming HSG polysilicon from the exposed capacitor storage node surface comprising undoped silicon and not from the exposed capacitor storage node surface comprising doped silicon.

40. The method of claim 39 wherein forming HSG polysilicon comprises:

in situ HF cleaning of exposed doped and undoped silicon surfaces;

seeding the exposed undoped silicon surface with polysilicon; and annealing the seeded surface at about 560° C. for about 20 minutes.

41. The method of claim 39 wherein forming HSG polysilicon comprises:

in situ HF cleaning of the exposed doped and undoped silicon surfaces;

seeding the exposed undoped silicon surface with polysilicon;

annealing the seeded surface at about 560° C. for about 20 minutes; and a polysilicon etch after the annealing to remove any monolayers of silicon.

* * * * *

UNITED STATES PATENT AND TRADEMARK OFFICE
CERTIFICATE OF CORRECTION

PATENT NO. : 6,309,941 B1
DATED : October 30, 2001
INVENTOR(S) : Kunal R. Parekh et al.

It is certified that error appears in the above-identified patent and that said Letters Patent is hereby corrected as shown below:

Column 2,
Line 3, replace "wordline a 26 and" with -- wordline 26 and--.

Column 4,
Line 9, replace "less than $5x10_{18}$" with -- less than $5x10^{18}$ --.

Column 7,
Line 38, replace "layers 146. 148" with -- layers 146, 148 --.

Column 8,
Line 66, replace "silicon; and forming a cell plate"
With -- silicon; and forming a cell plate --.

Signed and Sealed this

Seventh Day of May 2002

*Attest:*

*Attesting Officer*

JAMES E. ROGAN
*Director of the United States Patent and Trademark Office*